Aug. 15, 1950 R. F. SMELTZER 2,519,000

VARIABLE FREQUENCY OSCILLATOR

Filed Dec. 27, 1945

Inventor

RAYMOND F. SMELTZER

By Robert T. Killman

Attorney

Patented Aug. 15, 1950

2,519,000

UNITED STATES PATENT OFFICE 2,519,000

VARIABLE FREQUENCY OSCILLATOR

Raymond F. Smeltzer, Towson, Md., assignor to Bendix Aviation Corporation, South Bend, Ind., a corporation of Delaware Application December 27, 1945, Serial No. 637,373

13 Claims. (Cl. 250—36)

This invention relates to electrical oscillators, and more particularly to a single tube frequency controlled oscillator, wherein the oscillating frequency may be easily and efficiently varied between comparatively wide limits in accordance with a potential applied to a control electrode of the vacuum tube.

There are various usages in radio art for oscillator circuits, which provide electrical frequency control. Such circuits are, for example, desirable to hold the carrier frequency of a radio transmitter within specified limits. Automatic frequency control in superheterodyne receivers effects a variation of the local oscillator frequency as a function of the sense and magnitude of a direct current potential developed by a tuning detector. Such a system is usefully applied, also, to receiver sets with various forms of mechanical tuning—remote control or automatic station preselection—and provides accuracy of tuning after the mechanical device has roughly performed the selection of the signal. Likewise, in the field of frequency modulation, frequency control systems serve to modulate the frequency of a self-excited oscillator in accordance with the amplitude changes of an audio or other modulating signal wave.

It is desirable that the operation of such a control circuit should not affect the amplitude of oscillation, but should act to vary the frequency only. In order to maintain the sensitivity of the equipment, a large change in frequency should be produced by a small change in control bias, and this relation should hold over a sufficient frequency interval to take care of the greatest amount of unwanted mistuning or oscillator drift that will ordinarily be met with.

In the conventional circuits providing frequency control, a discriminator converts frequency shifts into proportional voltage changes. This voltage is fed to the control electrode of an electron discharge tube. Its input and output circuits are connected to the resonant circuit of the oscillator in such a manner as to cause a current flow through the tube which is substantially ninety degrees out of phase with the radio frequency voltages developed across the tank in the oscillator circuit. The tube acts thus as a reactance with respect to the resonant circuit of the oscillator, and the amount of reactive or quadrature current impressed upon the resonant circuit varies with the value of the bias voltage applied to the control electrode of the "reactance" tube. The resulting variation of the apparent reactance of the oscillatory circuit causes a proportional change of the frequency of the oscillations produced.

The heavy and variable damping of the tuned circuit by the phase shifting circuit and the influence of the quadrature component of the space current constitute a serious disadvantage of such designs. Moreover, the circuit arrangements are very complicated, and previous attempts to simplify them have not been very successful.

One of the objects of the invention is the provision of a means for producing sustained oscillations, the frequency of which may be varied in an easy and efficient manner.

Another object of the invention is the provision of an electron tube oscillator, whose frequency may be varied directly by a small change in bias potential applied to an electrode of the oscillator tube.

A further object of the invention is the provision of an oscillator, utilizing a single electron discharge tube for the maintenance of sustained oscillations as well as for the provision of a controllable reactive impedance which varies the effective oscillating frequency in accordance with a bias potential effecting said tube.

Still another object of the invention is the provision of a regenerative electron tube oscillator, wherein the total space current is divided to provide reactive components whose magnitudes are controlled by a control potential, and which are fed back upon the oscillating circuit for the control of the oscillator frequency.

Still another object of the instant invention is the provision of a feedback type electron tube oscillator wherein the total space current within the tube is divided and caused to flow through two external circuits, each of the external circuits including a reactive element, the two reactive elements differing either in magnitude, in phase, or both, and means whereby the application of a control potential to an additional electrode varies the proportion of the space current flow through each of the reactive elements, the net effect of the divided space current flow being effective to alter the frequency of the generated oscillations in accordance with the applied control potential.

Another object of the invention is the provision of a feedback type electron tube oscillator wherein the space current of the tube is placed effectively in shunt with a tank circuit associated therewith through a reactive feedback path and the amount of space current flow in said path is regulated by a control voltage applied to the tube.

Another object of the invention is the provision of a frequency controlled oscillator, which is simple in design, requires only one electron discharge tube, and a minimum of parts and circuit elements.

With these and other objects in view, the invention consists of certain novel details of construction and combination of parts, hereinafter fully described and claimed, it being understood that various modifications may be resorted to within the scope of the appended claims without departing from the spirit or sacrificing any of the advantages of the invention.

Other objects and advantages of the invention will become apparent from a consideration of the following description, taken in conjunction with the drawings, in which.

Figure 1:
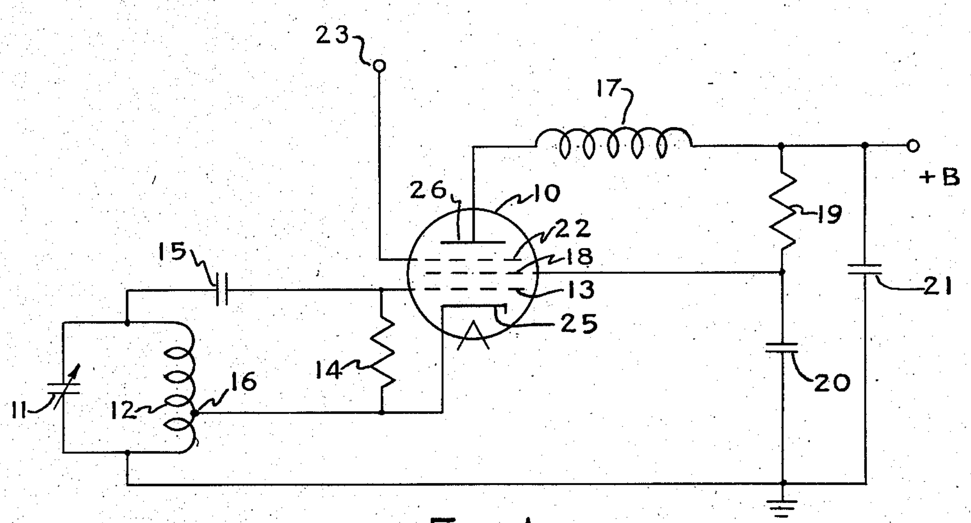
Figure 1 is a circuit diagram of an oscillator circuit embodying the principles of the invention.

Referring now to Figure 1, there is shown an electron discharge device 10, comprising a cathode 25, a control electrode 13, a screen electrode 18, a suppressor electrode 22, used here as a second control electrode, and an anode 26. An oscillatory tank circuit, comprising an inductor 12 shunted by a variable condenser 11, is connected between the control electrode 13 and ground. The cathode 25 of the electron discharge tube 10 is connected to a tap 16 on the inductor 12, at such a point as to provide proper distribution of radio frequency voltages between the control electrode 13 and the anode 26. The condenser 15 represents the customary self-biasing grid condenser, and the resistor 14 the leak resistance, which in combination provide a suitable operating bias potential for the oscillator circuit. The anode 26 of electron discharge tube 10 is connected to a voltage source B through an inductor 17, chosen to present a comparatively small inductive reactance at the mean operating frequency of the oscillator. The inductor 17 is grounded through a by-pass condenser 21. The screen electrode 18 of the electron discharge tube 10 is connected to the voltage source B through resistor 19, and grounded through a comparatively small condenser 20. The second control electrode 22 of the electron discharge tube 10 is connected to a control voltage terminal 23.

It will be manifest from the above-described arrangement that the circuit comprises a conventional Hartley oscillator, wherein the resonant tank circuit is effectively in shunt with the current path through the electron discharge tube 10. Sustained electrical oscillations are maintained in the tank circuit by means of two feedback circuits, one from the screen electrode 18 through the condenser 20, the other from the anode 26 through the inductor 17. Reactances of different phase are thus presented to the two feedback paths. It is a characteristic of the pentode type of tube that the division of current flow between the screen electrode and the anode is proportional to the potential of the suppressor electrode which is interposed between them. The space current through the electron discharge tube 10 will be divided in the space between the screen grid 18 and the anode 26. Two reactive current components will be impressed upon the oscillatory circuit and will affect and control its oscillation frequency. The distribution of space current between the inductive and capacitive feedback paths is controlled by the potential applied to control electrode 22. An increase in the inductive current component, for example, will then go hand in hand with a decrease in the capacitive current component, and the resulting variation of the oscillation frequency in the tank circuit will be proportional to the sum of the reactive current changes. A comparatively large variation in oscillation frequency can thus be obtained by a small change in control bias.

Figure 2:
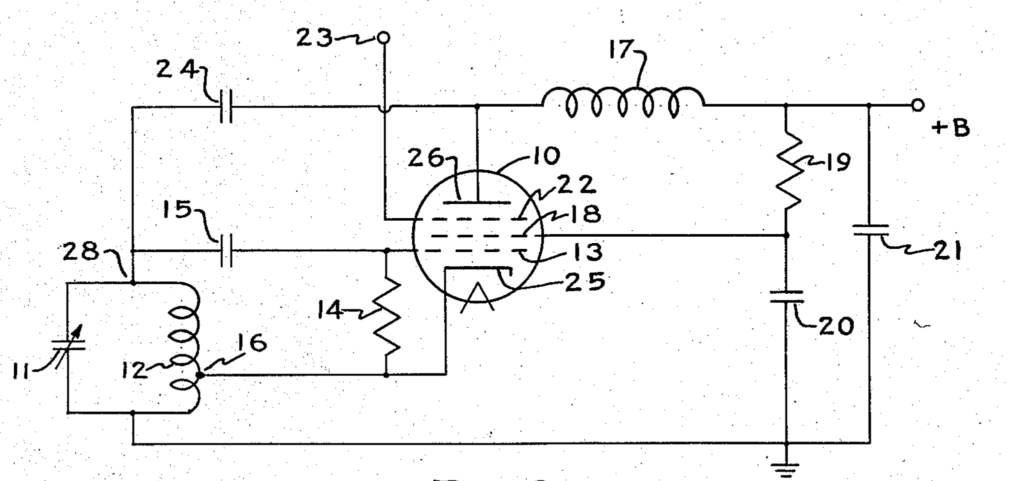
Figure 2 is a circuit diagram of a modification of the oscillator circuit shown in Figure 1.

Referring now to Figure 2, there is shown a modification of the circuit arrangement of Figure 1. A condenser 24 is connected between the anode 26 of electron discharge tube 10 and terminal 28 of the tuned circuit. The magnitude of the reactance reflected from the anode circuit will thus be further increased, and the range of frequency control which may be obtained by the invention will be considerably improved.

While the invention has been illustrated as employing a feedback network comprising parallel branches, one including a coil 17 and the other a condenser 20, it is to be understood that the inclusion of these elements is intended merely to indicate that the branches present to the resonant tank circuit reactances of differing phase angle and/or magnitude. Considering that coils and condensers do not present pure inductive and capacitive reactances and that the remainder of the circuit components, including the inter-electrode capacitances and the transductance of the discharge tube, contribute to the total effective reactance of the branches, the objects of the invention may be achieved by any selection of circuit components which result in feedback paths which present to the resonant tank circuit effective reactances of different phase angle and/or magnitude.

Furthermore, while large ranges of frequency variation are provided by the use of feedback branches presenting reactances of differing phase angle and/or magnitude, the maximum range occurring where the reactances are of opposite phase, smaller ranges of frequency control may be achieved by the provision of feedback paths of the same phase but of differing magnitudes. Thus the coil 17 and the condenser 20 could be replaced by two coils or two condensers so selected that the two feedback paths present to the tank circuit effective inductive or capacitive reactances of differing magnitude. Or these elements could be replaced by resistors of different values, relying upon the inter-electrode capacitances and transconductance of the discharge tube and the reactive effect of the circuit elements to supply total effective reactances in the branches of equal phase but different magnitudes. Further, one feedback path may be eliminated, utilizing the effect of the control voltage applied to the suppressor grid in varying the space current flow to the remaining path for the necessary frequency variation. Such limited ranges of frequency control are of use, for example, in controlling the frequency of a beat frequency oscillator.

It will be obvious that many changes and modifications may be made in the invention as described in the foregoing description without departing from its scope as defined by the appended claims.

What is claimed is:

1. In an oscillation generator circuit, an electron discharge tube having at least a cathode, a first control electrode, a screen grid, a second control electrode and an anode, all arranged substantially in the order named, a resonant tank circuit associated with said discharge tube, a reactive feedback path from the anode of the electron discharge tube to the first control electrode by way of said tank circuit, said feedback path having an effective reactance which is predominantly inductive, a second reactive feedback path from the screen grid of the electron discharge tube to said first control electrode by way of the tank circuit, said second feedback path having an effective reactance which is predominantly capacitive, and means for applying a control voltage to said second control electrode, thereby differentially varying the space current distribution through said reactive feedback paths in accordance therewith.

2. In an oscillation generator circuit, an electron discharge tube having at least a cathode, a first control electrode, a screen grid, a second control electrode and an anode, all arranged substantially in the order named, a resonant tank circuit associated with said discharge tube, a feedback path from the anode of the electron discharge tube to the first control electrode by way of said tank circuit, a second feedback path from the screen grid of the electron discharge tube to said first control electrode by way of the tank circuit, said feedback paths presenting reactances of differing characteristics, and means for applying varying control voltage to the second control electrode to correspondingly vary the frequency of the oscillations produced.

3. In an oscillation generator circuit, an electron discharge tube having at least a cathode, a first control electrode, a screen grid, a second control electrode and an anode, all arranged substantially in the order named, a resonant tank circuit associated with said discharge tube, a first feedback path from the anode of the electron discharge tube to the first control electrode by way of said tank circuit, a second feedback path from the screen grid of the electron discharge tube to said first control electrode by way of said tank circuit, said feedback paths presenting reactances of differing characteristics, and means for applying a control voltage to the second control electrode for differentially varying the space current distribution to said reactive feedback paths in accordance therewith, whereby the frequency of oscillation in the tank circuit is shifted in proportion to the sum of the reactance changes in the feedback circuits.

4. In an oscillation generator circuit, an electron discharge tube having at least a cathode, a first control electrode, a screen grid, a second control electrode and an anode, all arranged substantially in the order named, a resonant tank circuit associated with said discharge tube, means reactively coupling the tank circuit to the space current path in the electron discharge tube, a first feedback path from the anode of the electron discharge tube to the first control electrode by way of said tank circuit, a second feedback path from the screen grid of the electron discharge tube to said first control electrode by way of the tank circuit, said feedback paths presenting reactances of differing sign and magnitude, and means for applying a control voltage to said second control electrode for differentially varying the space current distribution to said reactive feedback paths in accordance therewith, thereby shifting the frequency of oscillation in the tank circuit in proportion to the sum of the reactance changes in said feedback circuits.

5. An electrical circuit for generating oscillations the frequency of which may be controlled by means of variations in a potential applied to one of the elements thereof comprising: a space discharge device having an electron emitting cathode, an oscillator grid, an electron collecting grid, a frequency control grid, and an electron collecting anode arranged in sequence therein; a resonant tank circuit connected between the oscillator grid and ground; the cathode being connected to a tap on the tank circuit; circuit means for applying a positive potential between both the electron collecting grid and ground and between the anode and ground; reactances of opposite sign, one of which is effectively connected between the anode and ground and the other of which is effectively connected between the electron collecting grid and ground; and means for applying a varying potential to the frequency control grid.

6. An electrical circuit for generating oscillations the frequency of which may be controlled by means of variations in a potential applied to one of the elements thereof comprising: a space discharge device having an electron emitting cathode, an oscillator grid, an electron collecting grid, a frequency control grid and an electron collecting anode arranged in sequence therein; a resonant tank circuit connected between the oscillator grid and ground; the cathode being connected to a tap on the tank circuit; circuit means for applying a positive potential between both the electron collecting grid and ground and between the anode and ground; reactances of different magnitudes, one of which is effectively connected between the anode and ground and the other of which is connected between the electron collecting grid and ground; and means for applying a varying potential to the frequency control grid whereby the ratio of the anode space current to the electron collecting grid's space current may be correspondingly varied.

7. An electrical circuit for generating oscillations the frequency of which may be controlled by means of variations in a potential applied to one of the elements thereof comprising: a space discharge device having an electron emitting cathode, an oscillator grid, an electron collecting grid, a frequency control grid, and an electron collecting anode arranged in sequence therein; a resonant circuit associated with the space discharge device; a reactance connected between the resonant circuit and one of the electron collecting elements; means for applying a positive potential to the anode and to the electron collecting grid; means for providing alternating current paths from the anode and the electron collecting grid to ground; reactances of opposite signs, one of which is included in each alternating current path; and means for applying a variable potential to the frequency control grid.

8. An electrical circuit for generating oscillations whose frequency may be controlled by means of variations in a potential applied to one of the elements thereof comprising: a space discharge device having an electron emitting cathode, an oscillator grid, an electron collecting grid, a frequency control grid, and an electron collecting anode arranged in sequence therein; a resonant tank circuit connected between the oscillator grid and ground; means connecting the cathode to a tap on the tank circuit; a reactance connected between the resonant circuit and at least one of the electron collecting elements; means for applying a positive potential between the electron collecting grid and ground and between the anode and ground; reactances of opposite sign one of which is connected between the anode and the source of positive potential and the other of which is connected between the electron collecting grid and ground; and means for applying a varying potential to the frequency control grid.

9. An electrical circuit for generating oscillations whose frequency may be controlled by means of variations in a potential applied to one of the elements thereof comprising: a space discharge device having an electron emitting cathode, an oscillator grid, an electron collecting grid, a frequency control grid, and an electron collecting anode arranged in sequence therein; a resonant circuit associated with the space discharge device; means for applying a positive potential to the anode and to the electron collecting grid; a reactance included in the anode circuit; a second reactance of sign opposite to the first mentioned reactance included in the electron collecting grid circuit; and means for applying a variable potential to the frequency control grid whereby the ratio of the anode space current to the electron collecting grid space current may be correspondingly varied.

10. An electrical circuit for generating oscillations the frequency of which may be controlled by means of variations in a potential applied to one of the elements thereof comprising, a space discharge device having an electron emitting cathode, an oscillator grid, an electron collecting grid, a frequency control grid, and an electron collecting anode arranged in sequence therein, a resonant tank circuit connected between the oscillator grid and ground, the cathode being connected to a tap on the tank circuit, circuit means for applying a positive potential between both the electron collecting grid and ground and between the anode and ground, an inductance connected between the anode and the source of positive potential, a capacity connected between the electron collecting grid and ground, a capacity connected between the resonant circuit and the anode, and means for applying a varying potential to the frequency control grid.

11. In an oscillation generator circuit, comprising an electron discharge tube having at least a cathode, a first control element, a first electrode acting as an anode, a second control element and a second electrode acting as an anode in the order named, a resonant tank circuit associated with the first control element, a first feedback circuit associated with said first electrode acting as an anode and a second feedback circuit associated with said second electrode acting as an anode; means in at least one of the feedback circuits for production of a phase displacement between the feedback from the first feedback circuit and the feedback from the second feedback circuit, and means associated with the second control element for differential control of the feedback through the two feedback circuits.

12. In an oscillation generator circuit, comprising an electron discharge tube having at least a cathode, a first control grid, a first electrode acting as an anode, a second control grid and a second electrode acting as an anode in the order named, and a resonant tank circuit associated with the first control grid: two feedback circuits of different reactance associated with said electrodes acting as anodes and differentially controlled by the second control grid.

13. In an oscillation generator circuit, comprising an electron discharge tube having at least a cathode, a first control grid, a first electrode acting as an anode, a second control grid and a second electrode acting as an anode in the order named, and a resonant tank circuit associated with the first control grid: two feedback circuits of different reactance associated with said electrodes acting as anodes and differentially controlled by a signal applied to the second control grid.

RAYMOND F. SMELTZER.

REFERENCES CITED

The following references are of record in the file of this patent:

UNITED STATES PATENTS

| Number | Name | Date |
|---|---|---|
| 2,004,101 | Cohn | June 11, 1935 |
| 2,066,027 | Braaten | Dec. 29, 1936 |
| 2,073,454 | Peterson et al. | Mar. 9, 1937 |
| 2,313,071 | Hodgson | Mar. 9, 1943 |
| 2,350,171 | Lawrence | May 30, 1944 |
| 2,373,079 | Morelock | Apr. 3, 1945 |

FOREIGN PATENTS

| Number | Country | Date |
|---|---|---|
| 246,892 | Great Britain | Feb. 3, 1926 |